(12) United States Patent
Corcoran (10) Patent No.: US 6,714,581 B2
(45) Date of Patent: Mar. 30, 2004

(54) COMPACT PHASE LOCKED LASER ARRAY AND RELATED TECHNIQUES

(76) Inventor: Christopher J. Corcoran, 8 Millfield St., Woods Hole, MA (US) 02543

(*) Notice: Subject to any disclaimer, the term of this patent is extended or adjusted under 35 U.S.C. 154(b) by 22 days.

(21) Appl. No.: 09/968,293

(22) Filed: Oct. 1, 2001

(65) Prior Publication Data

US 2003/0063631 A1 Apr. 3, 2003

(51) Int. Cl.[7] .............................. H01S 3/08; H01S 5/00
(52) U.S. Cl. ....................................... 372/101; 372/50
(58) Field of Search ..................... 372/71.5, 97, 101; 359/619

(56) References Cited

U.S. PATENT DOCUMENTS

| | | | | |
|---|---|---|---|---|
| 4,246,548 A | * | 1/1981 | Rutz | 372/44 |
| 4,479,224 A | | 10/1984 | Rediker | |
| 4,813,762 A | * | 3/1989 | Leger et al. | 359/565 |
| 4,818,062 A | * | 4/1989 | Scifres et al. | 385/33 |
| 5,027,359 A | * | 6/1991 | Leger et al. | 372/18 |
| 5,081,637 A | * | 1/1992 | Fan et al. | 372/72 |
| 5,115,444 A | | 5/1992 | Kirkby et al. | |
| 5,139,609 A | * | 8/1992 | Fields et al. | 372/50 |
| 5,217,290 A | * | 6/1993 | Windross | 362/554 |
| 5,365,541 A | * | 11/1994 | Bullock | 372/99 |
| 5,369,659 A | * | 11/1994 | Furumoto et al. | 372/50 |
| 5,600,666 A | * | 2/1997 | Hiiro | 372/24 |
| 5,608,745 A | | 3/1997 | Hall et al. | |
| 5,661,747 A | * | 8/1997 | Hiiro | 372/101 |
| 5,745,511 A | | 4/1998 | Leger | |
| 5,787,107 A | * | 7/1998 | Leger et al. | 372/71 |
| 5,802,092 A | * | 9/1998 | Endriz | 372/50 |
| 5,923,475 A | * | 7/1999 | Kurtz et al. | 359/619 |
| 6,021,141 A | | 2/2000 | Nam et al. | |
| 6,075,912 A | | 6/2000 | Goodman | |
| 6,212,216 B1 | * | 4/2001 | Pillai | 372/96 |
| 6,243,407 B1 | | 6/2001 | Mooradian | |
| 6,385,229 B1 | * | 5/2002 | Hiiro | 372/101 |

OTHER PUBLICATIONS

Leger, James R. et al. "Coherent addition of AlGaAs lasers using microlenses and diffractive coupling", Appl. Phys. Lett. 52 (21), May 23, 1988, pp. 1771–1773.

D'Amato, F.X. et al. "Coherent operation of an array diode lasers using a spatial filter in a Talbot cavity", Appl. Phys. Lett. 55 (9), Aug. 28, 1989, pp. 816–818.

Mehuys, David et al. "Modal analysis of linear Talbot—cavity semiconductor lasers", Optics Letters, Jun. 1, 1991, vol. 16, No. 11, pp. 823–825.

Fader, W.J. et al. "Normal modes of N coupled lasers", Optics Letters, vol. 10, No. 8, Aug. 1995, pp. 381–383.

Botez, D. et al. "Diode Laser Arrays", Cambridge Studies in Modern Optics, pp. 1–3.

"Phase–Locked Array of Antiguided Lasers with Monolithic Spatial Filter", Electronics Letters, vol. 25, No. 5, Mar. 2, 1989, pp. 365–367.

Wrage, M. et al. "Combined phase locking and beam shaping of a multicore fiber laser by structured mirrors", Optics Letters, vol. 26, No. 13, Jul. 1, 2001, pp. 980–982.

(List continued on next page.)

*Primary Examiner*—Paul Ip
*Assistant Examiner*—Phillip Nguyen
(74) *Attorney, Agent, or Firm*—Daly, Crowley & Mofford, LLP (57) ABSTRACT

An electro-optical system includes a plurality of electro-magnetic gain media having a corresponding plurality of apertures. The apertures are disposed in a predetermined spatial distribution. The system further includes a refracting surface disposed to intercept energy from the plurality of apertures and a partially reflecting surface to direct portions of the intercepted energy back toward the plurality of apertures with the directed energy being distributed about the plurality of apertures.

39 Claims, 8 Drawing Sheets

OTHER PUBLICATIONS

Mehuys, D. et al. "Supermodel control in diffraction—coupled semiconductor laser arrays", Appl. Phys. Lett. 53 (13) Sep. 26, 1988, pp. 1165–1167.

"Module 3–11 Seimiconductor Lasers; " The Center for Occupational Research and Development FIPSE–Supported Curriculum Morphing Project; Course 3, module 11, Semiconductor Lasers; from the website: http://cord.org.cm/leot/course03_mod11/mod03_11.htm; pp. 1–22.

"Module 6–9 Gratings;" The Center for Occupational Research and Development; 1998; ISBN 1–55502–084–0; from the website: http://cord.org/cm/leot/course06_mod09/mod06_09.htm; pp. 1–21.

Corcoran; "Compact Phase–Locked Fiber–Laser Array;" Phase I Small Business Innovation Research (SBIR) Program; Proposal #B011–0269, Topic #BMDO01–001; pp. 3–24 plus SBIR proposal.

Corcoran; "Phase Locked Fiber Laser Array in Compact External Cavity;" Phase I Small Business Innovation Research (SBIR) Program; Proposal #F001–2965, Topic #AF00–002; pp. 3–25 plus SBR proposal.

Caola; "Self–Fourier Functions;" Letter to the Editor; J. Phys. A: Math. Gen. 24 (1991) printed in UK; 1991 IOP Publishing Ltd.; 0305–4470/91/191143+02; pp. L1143–L1144.

Lohmann et al.; "Self–Fourier Objects and Other Self–Transform Objects;" 1992 Optical Society of America; vol. 9, No. 11/ Nov.1992/J.Opt.Soc.Am.A; 0740/3232/92/112009–04; pp. 209–2012.

Cincotti et al.; "Generalized Self–Fourier Functions;" Letter to the Editor, J. Phys. A: Math. Gen. 25 (1992) printed in UK; 1992 IOP Publishing Ltd.; 0305–4470/92/201191+04; pp. L1191–L1194.

Lipson; Self–Fourier Objects and Other Self–Transform Objects: Comment; 1993 Optical Society of America/vol. 10, No. 9/Sep. 1993; 0740–3232/93/092088–02; pp. 2088–2089.

Coffey; "Self–Reciprocal Fourier Functions;" J.Opt.Soc. Am. A, vol. 11, No. 9/Sep. 1994; pp. 2453–2455.

* cited by examiner

COMPACT PHASE LOCKED LASER ARRAY AND RELATED TECHNIQUES

FIELD OF THE INVENTION

This invention relates generally to electro-optical systems and more particularly to electro-optical systems having a plurality of gain media to produce a composite, coherent beam of energy.

BACKGROUND OF THE INVENTION

As is known in the art, electro-optical systems have a wide range of applications. Many of these applications include the use of a plurality of gain media to produce a composite, coherent beam of energy. Some of these applications are medical, and defense applications where it is often desirable to utilize high power laser electro-optical systems. The development of high power laser systems such as chemical lasers and gas lasers, has achieved some significant levels of laser power. These applications include metal cutting and welding, medical procedures such as Transmyocardial Revascularization (TMR) to treat coronary artery disease, direct printing and engraving, and defense weapons. However, many laser systems currently used in these applications remain complex, cumbersome and have drawbacks such as low efficiency, and the requirement for non-renewable energy sources. These laser systems are not readily scalable to higher power ranges.

If high power laser systems are to become more effective and widespread, new laser technologies are required that provide more compact, efficient, stable and higher powered than systems currently available. For example, diode-pumped fiber lasers have demonstrated efficient electrical-to-optical power conversion into a diffraction-limited laser beam. Single mode outputs of over 100 W have been reported from a fiber laser pumped by semiconductor diode lasers. The conversion of the multimode output of the diode laser pump to the single mode fiber output can be achieved with a quantum efficiency of approximately 85%, resulting in an overall efficiency of the order of 30%. These individual lasers can be constructed to be rugged and compact. Their electric energy source is widely available, easily renewed, and can be generated by many different techniques in any environment including space or under water. However, intrinsic characteristics such as non-linear effects inside the small single-mode core of the fiber ultimately limit the output power generated individually by such devices. The power output of an individual diode-pumped fiber laser will ultimately be limited by the damage threshold of the fiber core and cladding materials, as well as facet coatings.

In order to circumvent these limitations and generate scalable high output power levels in a diffraction-limited beam, laser systems can coherently combine the output of several fiber lasers. As is known in the art, the technique of phase locking allows combining several optical beams into a single beam. This technique combines the output power of each individual optical beam while preserving the spatial and spectral coherence of each individual beam. This approach enables the scalability of laser systems that can produce high power coherent diffraction-limited beams.

Coherent combination of multiple beams can be achieved by several different techniques. These techniques require that all the beams have the same wavelength, the same polarization, and be phase locked in the proper phase state in the plane of combination. In a laser system, this can be accomplished in several different ways. For example, one can use a single beam to "seed" or injection-lock all the laser beams to be combined, thus ensuring that they be all at the same wavelength and polarization, and that a stable coherent phase regime exists for each source. One then needs to control or adjust the phases of all the laser beams to achieve coherent combination. Laser beams can also be combined in series with a nearest neighbor using the Talbot effect as in known in the art.

Another technique is to optically couple all the laser beams together in parallel in a common cavity, thus ensuring that they are all at the same frequency and in a single coherent phase state. External-cavity coupling of laser diodes has been successfully demonstrated to produce output beams both spectrally coherent as well as spatially coherent.

Many conventional external cavity laser designs utilize a "4-F" optical configuration. The "4-F" refers to the four focal length size of the external cavity. This technique uses two lenses inside the external cavity to Fourier transform the optical input pattern (i.e. electric field amplitude) a total of 4 times in a single round trip, resulting in an identity operation as described in "Introduction to Fourier Optics", by Joseph W. Goodman published by Mcgraw Hill Book Company, 1968. A spatial filter is placed at the Fourier plane and only allows light intensity (magnitude squared of the Fourier Transform of the input electric field pattern) which is coherent between the multiple gain elements to pass through the filter. The radiation beam must pass through the spatial filter twice before reentering the gain media. The double pass through the spatial filter reduces the overall efficiency of the laser array. The 4-F designed laser arrays require polarization adjusters, phase adjusters and the spatial filter in the path of the radiation. Some of the problems associated with these designs include their large size, complexity, the need for numerous adjustments and stability of the laser output.

Thus, in high power laser applications, there is a need for a system to efficiently combine multiple laser sources using a compact external cavity design to provide a stable phased locked output without requiring numerous adjustments.

SUMMARY OF THE INVENTION

In accordance with the present invention, an electro-optical system is provided having a plurality of electromagnetic gain media having media having a corresponding plurality of apertures disposed in a predetermined spatial distribution. The system further includes a refracting surface disposed to intercept energy from the plurality of apertures and a partially reflecting surface to direct a portion of the intercepted energy back toward the plurality of apertures with the directed energy being distributed about the plurality of apertures. The predetermined spatial distribution of the apertures is selected to provide a spatial filter to establish a composite beam comprised of energy from the plurality of gain media with phase coherency.

In accordance with one feature of the invention, an electro-optical system is provided having a plurality of apertures for a plurality of electromagnetic gain media. The apertures have spacings therebetween, and the spacings are disposed in a predetermined spatial distribution. The system further includes a common element disposed to intercept energy from the apertures media and direct the energy back to the plurality of gain media through the apertures. The directed energy is distributed about the plurality of apertures with the spacings providing a spatial filter to establishing a composite beam comprised of energy from the plurality of gain media, such beams in the composite beam having phase coherency.

With such an arrangement, the cavity is shorter, more compact, more stable, and much simpler than many traditional external cavity architectures, because the external cavity requires only half of the focal length (f) of the common element as the total length of the external cavity and does not require a dedicated spatial filter element.

In accordance with a further aspect of the present invention, a method to produce a phase coherent beam includes the steps of providing a plurality of apertures for a plurality of electromagnetic gain media producing a plurality of radiation beams. A refracting surface and a partially reflecting surface are disposed to reflect portions of the radiation. The method includes spacing entrance apertures of each of the plurality of electromagnetic gain media apart to provide a predetermined spatial distribution. The spatial distribution of spacing between the apertures provides a spatial filter and establishing a composite beam comprised of energy from the plurality of gain media with phase coherency. With such a technique, the outputs of a spatially separated multitude of laser or gain media outputs can be coherently combined into a composite beam and many types of laser or gain media source can be coupled together.

In accordance with a further aspect of the present invention, an electro-optical system is provided having a plurality of electromagnetic gain media having apertures disposed in a predetermined spatial distribution. The system further includes a common element disposed to intercept energy from the plurality of electromagnetic gain media and form an interference pattern across the apertures, such interference pattern having regions of constructive interference and regions of destructive interference. The regions of constructive interference are disposed on the apertures producing a composite beam comprised of energy from the plurality of gain media with phase coherency. With such an arrangement, energy from the gain media in the regions of constructive interference is fed back into the individual apertures of the gain media. The energy feedback into the gain media provides output energy having a coherent phase relation with a portion of the energy in the gain media and a cavity of the electro-optical system without requiring a dedicated spatial filter element.

In one embodiment, an assembly having a cavity uses a plurality of optical energy gain media with apertures spaced apart to provide an input optical pattern which is a very close match to the Fourier Transform of the input optical pattern when the elements are phase locked together and emitting radiation as a coherent array. The cavity and optical input pattern are used to optically fold the optical gain media beam back on itself in such a manner as to couple energy amplified by the plurality of optical gain media together and to provide phase locking of the energy amplified by the plurality of gain media. Therefore optical gain media are spaced apart by a predetermined spatial distribution in the assembly, and more particularly the associated apertures perform the role of a spatial filter in the cavity.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1A:
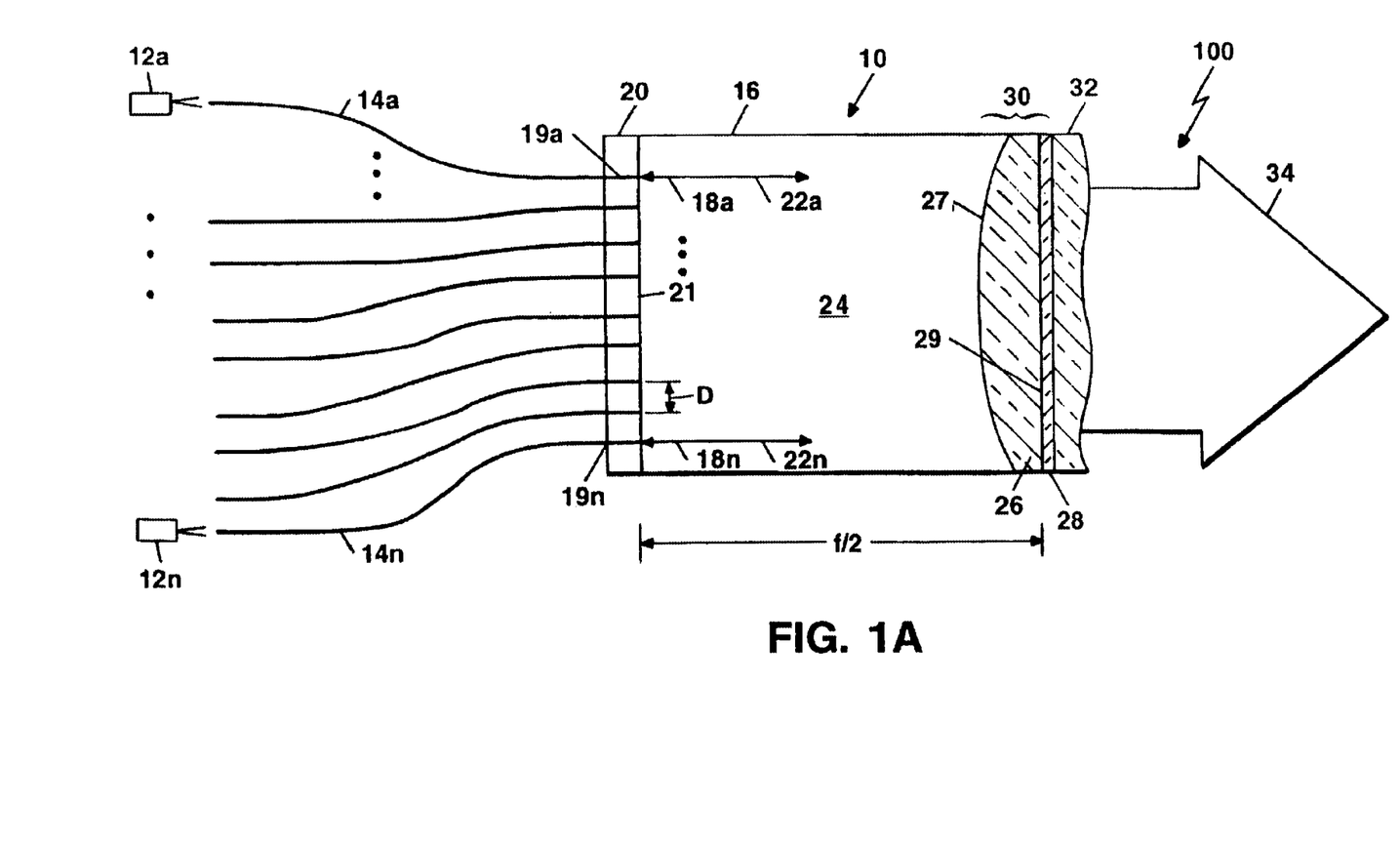
FIG. 1A is a schematic diagram of a compact phase locked laser array electro-optical system according to the invention.

Referring now to FIG. 1A, an electro-optical system, here a laser array system 100 is shown to include an assembly 10 having a first end 20, a common element 30, and a housing 16. The housing 16 has an internal cavity 24. An absorbing surface 21 is disposed on the first end 20. The common element 30 includes a lens 26 and a reflector 28. The lens 26 has a refracting surface 27 and the reflector 28 has a partially reflecting surface 29. The laser array system 100 further includes a plurality of electromagnetic gain media 14a–14n (generally referred to as gain media 14), here for example, fiber lasers. The gain media 14a–14n are disposed on a corresponding plurality of slots 19a–19n arranged on the first end 20 of the assembly 10.

Each one of the gain media 14a–14n is electromagnetically coupled to a corresponding one of a plurality of electromagnetic gain media energy sources 12a–12n, here for example, pump diodes. Each one of the gain media 14a–14n includes a corresponding one of a plurality of ports or apertures 18a–18n (generally referred to as apertures 18). More particularly, the gain media 14 amplify electromagnetic energy fed thereto via the energy sources 12 and the amplified energy is then electromagnetically coupled to the internal cavity 24 via apertures 18 to thereby provide a plurality of radiation beams 22a–22n within the internal cavity 24. The radiation beams 22a–22n are emitted from apertures 18a–18n as separate beams, the radiation beams 22a–22n are combined in parallel by the refracting surface 27 and the partially reflecting surface 29 into a single composite output beam 34. The output beam 34 is referred to as a single beam because the array emits the combined radiation as a coherent bundle.

In the embodiment shown in FIG. 1A, the output beam 34 is a coherent laser beam also referred to as a phase locked laser beam. It should be noted that the assembly 10 emits energy coherently in a phase locked manner and there is negligible radiation incident upon the absorbing surface 21.

The apertures 18a–18n of the gain media 14 are spaced apart from a neighboring aperture 18 by a predetermined distance D. That is, the apertures 18 and the corresponding spacings disposed therebetween, which are coated with energy absorbing material, are disposed in a predetermined spatial distribution. As will be described in more detail hereinafter, the apertures 18 and the corresponding spacings disposed therebetween provide a spatial filter. The common element 30 is spaced apart from the plurality of apertures 18 by approximately one half a focal length of the common element 30. The assembly 10 is also referred to as a half-f cavity because of the half-f spacing between the common element 30 and the plurality of apertures 18. The laser array system 100 further includes beam shaping optics 32 adjacent to the assembly 10 to shape the output beam 34.

In operation, the pump diode energy sources 12 pump the gain media 14 at the nominal operating wavelength of the diodes, here for example a wavelength of approximately 0.83 $\mu$m. As is known in the art, the energy from the pump diode energy sources 12 is absorbed by the fibers, and is re-emitted in a coherent manner, here for example at a wavelength of approximately 1.06 $\mu$m. It will be appreciated by those of ordinary skill in the art, that although the laser array system 100 is shown operating fiber lasers as the gain media 14, the assembly 10 can be used to couple together many types or number of lasers including but not limited to diode pumped fiber lasers, fiber coupled diode lasers, gas lasers, diode pumped solid state lasers, and monolithic diode arrays. The energy of the gain media 14 is electromagnetically coupled via apertures 18 into the assembly 10 as beams 22 and directed to the common element 30. The partially reflecting surface 29 of the common element 30 intercepts energy (i.e., beams 22) from the plurality of electromagnetic gain media 14 and directs portions of the energy back to the plurality of gain media 14 with the directed energy being distributed about the plurality of apertures 18. The refracting surface 27 of the common element 30 provides a Fourier Transform of the energy from the plurality of gain media 14. The transform couples together the outputs of the gain media 14 to provide an interference pattern at the apertures 18. The energy of the interference pattern is fed back into the apertures of the gain media (as described in more detail in conjunction with FIGS. 2–6).

The plurality of apertures 18 has a corresponding Fourier plane (also referred to as a spatial frequency plane) and the apertures 18 are disposed in this Fourier or spatial frequency plane. It should be noted, that a stable interference pattern is formed only when the radiation emitted from apertures 18 is spatially coherent across the apertures 18. To put it another way, the radiation providing feedback into the apertures 18 is phase locked.

The reflector 28 is a partially reflecting end mirror, here for example, 90 percent reflective) made of coated glass, for instance, which could be joined to the lens 26 to form the common element 30 which directs energy back to the apertures and gain media 14. It should be noted that the lens 26 and reflector 28 can be replaced by a single element or a combination of optical elements such as a diffraction grating or a curved mirror. The lens 26 is spaced apart from the apertures 18 of gain media 14 by a distance of approximately f/2. The partially reflecting surface 29 enables the common element 30 to direct the energy back to the plurality of apertures 18.

The radiation beams 22 are spatially transformed by the lens 26 and partially reflected by the reflector 28 (as described below in conjunction with FIGS. 2–6). The apertures 18 spaced apart by distance D and the corresponding spacings disposed therebetween provide a spatial filter in the internal cavity 24. The radiation feedback of the reflected energy through the spatial filter directed into the apertures 18 provides phase coherency in the output beam 34. The beam shaping optics 32 transforms the radiation leaving the internal cavity 24 into the composite plane wave output beam 34 having phase coherency. That is, the plurality of beams 22a–22n combine within the internal cavity 24 to exit the assembly 10 as the output beam 34. The components of the output beam 34 (i.e., beams 22a–22n) are combined by the assembly 10, including the spatial filter to all be coherent, one with the other, when they leave the internal cavity 24 as the output beam 34.

In one embodiment, the absorbing surface 21 of the first end 20 inside the assembly 10 is painted black or coated with an energy absorbing material. The absorbing material, here for example, black paint is selected to absorb the energy which is directed to corresponding spacings disposed between apertures 18. The spacing D is chosen to minimize the energy absorbed by the absorbing surface 21, to maximize the energy fed back into apertures 18, and to cause substantially all of the light having the desired composite, coherent nominal wavelength to be combined in parallel to produce the output beam 34 output of the assembly 10 in a manner to be described in more detail hereinafter.

In one embodiment, the housing 16 of the assembly 10 is preferably constructed from material with iron alloys, known in the art, that exhibit extremely low thermal expansion coefficients and provide excellent thermal stability, such as Invar or Super Invar (which has a low thermal expansion coefficient of $3.6 * 10^{-7} K^{-1}$) in order to minimize misalignment due to thermal variations. The housing 16 optionally includes additional supports (not shown) for improving thermal stability, mounts (not shown) for the gain media 14 and brackets (not shown) for mounting the common element 30. Alternatively, the housing 16 can be constructed as a monolithic structure to provide a high level of system stability.

Figure 1B:
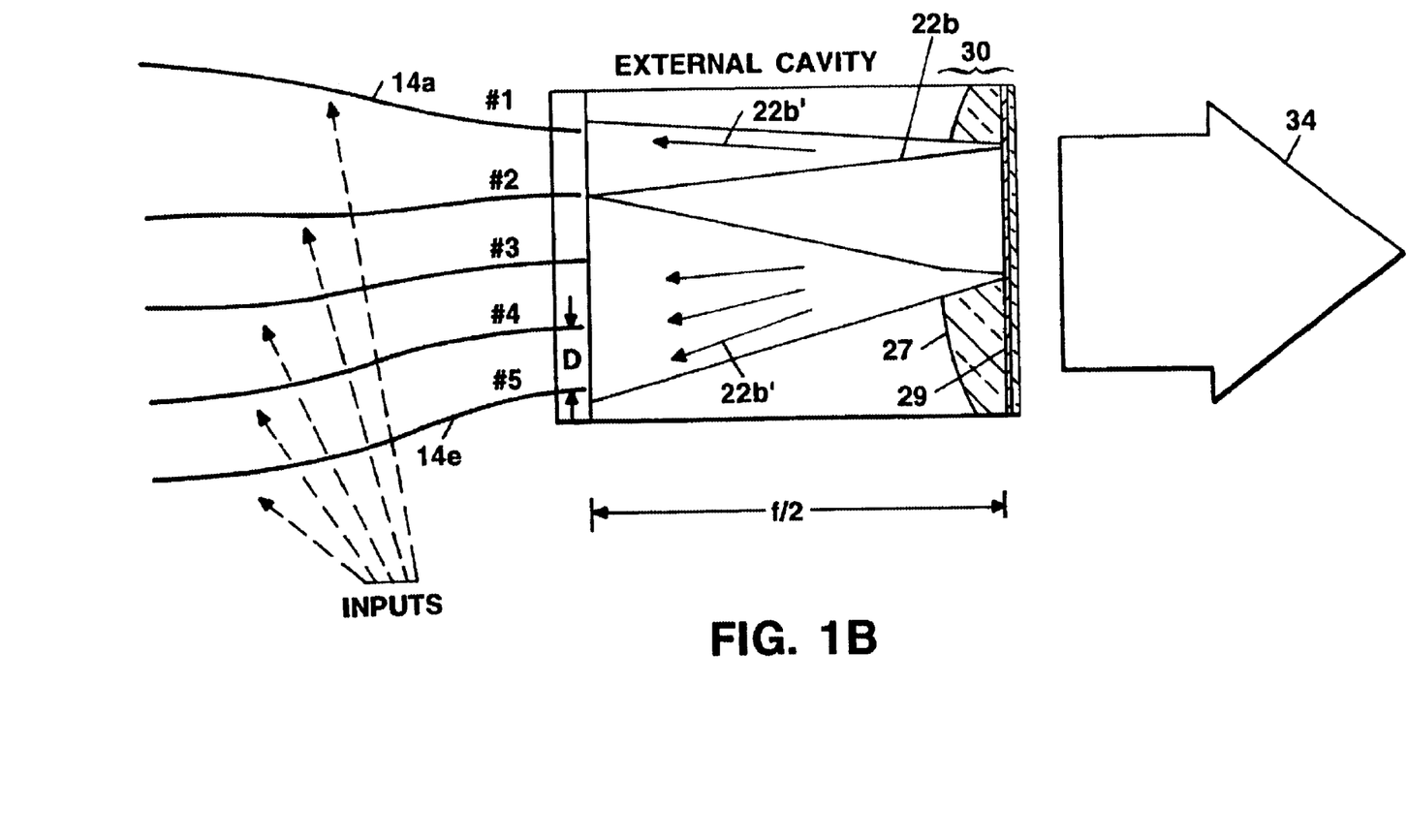
FIG. 1B is a schematic diagram of the parallel coupling of the radiation from one aperture to the plurality of apertures according to the invention.

Now referring to FIG. 1B, the refracting surface 27, here, provided by lens 26 intercepts the energy from the plurality of apertures 18. For example, as shown in FIG. 1B, energy from aperture 18b is intercepted by the refracting surface 27 of the common element 30 and portions of the energy in reflected beams 22b' are directed substantially back to the plurality of apertures 18 by the partially reflecting surface 29 and distributed over all of the apertures 18a–18e in the cavity 24. The process of directing energy from each aperture 18a–18e into all of the apertures 18, as illustrated in FIG. 1B, is known in the art as parallel coupling.

Series coupling, as used in other optical systems, differs from parallel coupling in that energy from an aperture is coupled only to a nearest neighbor in a series coupled optical system. Parallel coupling provides an output beam 34 having a higher degree of coherency compared to series coupling as the number of apertures 18 is increased for a given size cavity.

Figure 2:
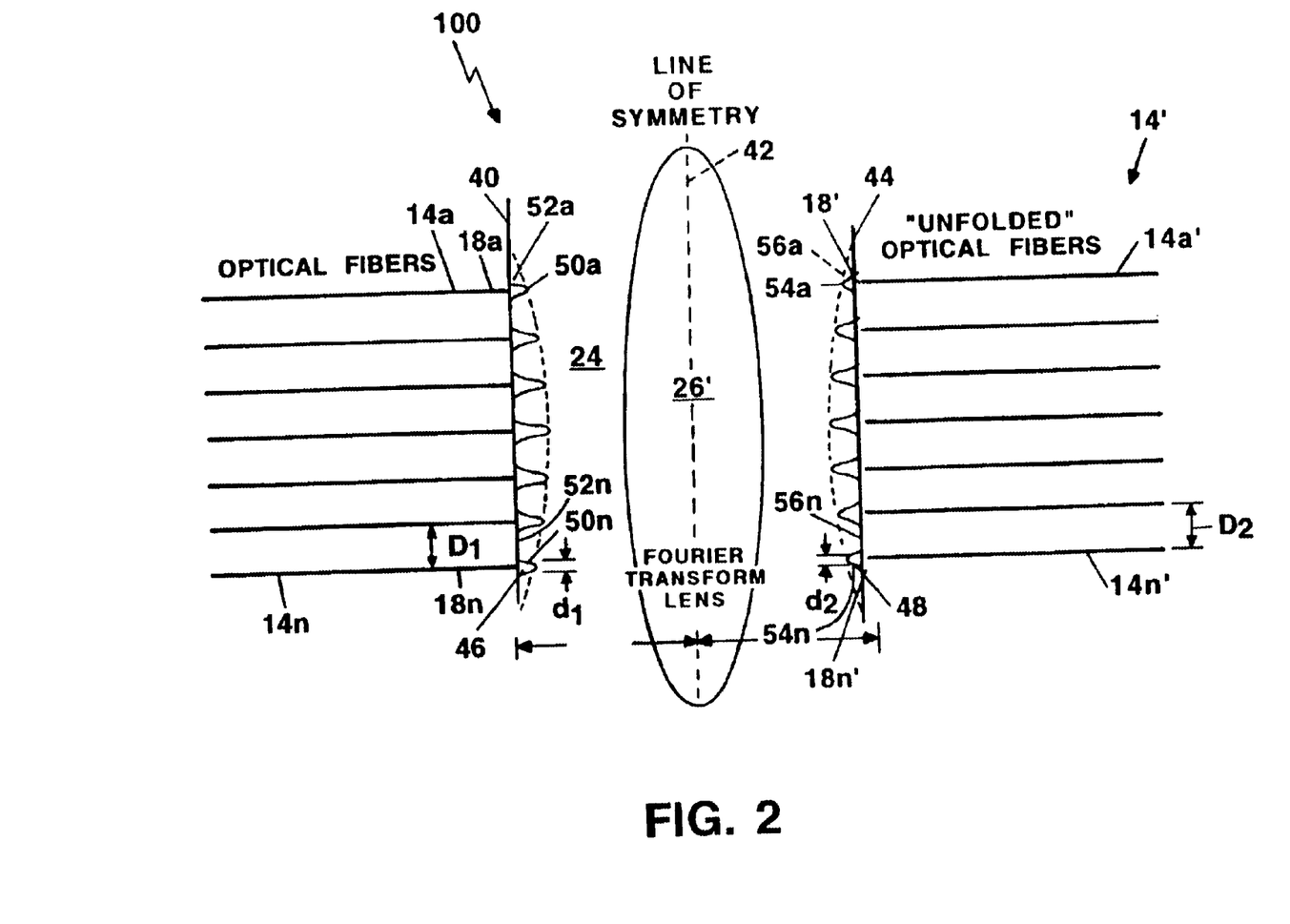
FIG. 2 is a schematic diagram useful in understanding the operation of the system of FIG. 1A, such FIG. 2 showing unfolded optical paths of the system of FIG. 1A.

Now referring to FIG. 2, an "unfolded" geometry, which is not a physical embodiment but is used to help understand the combining operation of the assembly 10, includes an equivalent lens 26'. The lens 26' is symmetrical about a line or axis of symmetry 42. Unfolded gain media 14' including apertures 18' are shown physically separate from gain media 14 for illustrative purposes. Like reference numbers indicate like elements as shown in FIG. 1A. An electric field pattern 46 is produced at an input plane 40. The "doubled" lens 26' (with focal length F) provides a Fourier transformation of the electric field pattern at the input plane 40 to produce an output electric field interference pattern 48 at an output plane 44. An output electric field pattern 48 is an interference pattern which includes regions of constructive interference 54a–54n and regions of destructive interference 56a–56n. The apertures 18 are arranged so that the energy in the regions of constructive interference 54 are fed back into the gain media at the apertures 18 providing output energy having a coherent phase relation with a portion of the energy in the gain media 14 and the internal cavity 24 of the electro-optical system 100 without requiring a dedicated spatial filter element.

Through the action of the lens 26' in the internal cavity 24, the Fourier transform of the electric field pattern 46 at the input plane 40 is the output electric field pattern 48 at the output plane 44. The output electric field pattern 48 is reflected back onto the input plane 40. This transformation provides sufficient coupling back into the gain media 14 of the radiation within the external internal cavity 24 in order to achieve laser operation. The optical radiation will only couple back into the gain media 14 if the laser elements are coherently phase locked and form the appropriate interference pattern at the input plane of the internal cavity 24. This is achieved by arranging the gain media 14 (or apertures 18) in a very specific arrangement, to ensure that the Fourier transform of the gain media input pattern into the assembly 10 is a close match to the gain media input pattern 46 itself.

The spacing of apertures 18 is determined by the Fourier transform of a comb function (spacing $D_1$) which provides a comb output function with spacing $D_2$, where $D_2 = F^* \lambda / D_1$; F is the focal length of the doubled lens to account for the round trip passage; and $\lambda$ is operating wavelength.

Comparing FIG. 1A and FIG. 2, it can be seen that when the lens 26' is doubled as shown in FIG. 2, the focal length (F) is one half the focal length (f) of the lens as shown in FIG. 1A.

That is, $F = f/2$.

In order to achieve the condition that the radiation fold back on itself and reproduce the optical input pattern, the aperture 18 spacing D (FIG. 1A) is set at the input to the cavity to be:

$$D = \sqrt{f/2 \cdot \lambda} \text{ or equivalently } D = \sqrt{F \cdot \lambda}$$

where f is the focal length of lens 26 (FIG. 1A) and $\lambda$ is the nominal wavelength of the output beam 34 (FIG. 1A).

For example, a focal length of f=8.0 cm for lens 26 (F=4.0 cm), and an operating wavelength of approximately 1.1 $\mu$m for output beam 34, the spacing D of the apertures 18, corresponding to a center-to-center fiber is spacing of approximately 209.8 $\mu$m. Note that the focal length F is the appropriate focal length for light making a round trip through the lens 26. The non-reflective spacings D between the apertures 18 themselves perform the role of a spatial filter. Although the laser array system 100 as shown in FIGS. 1A and 2 depicts a one dimensional device, it now will be appreciated by those of ordinary skill in the art that the Fourier transforming characteristics discussed are all readily extended to two dimensions and that the gain media 14 could be a two dimensional gain media array. Optionally, a lens array (not shown) can be incorporated at the input plane into the cavity to individually collimate the individual radiation beams 22a–22n (FIG. 1A). Reducing the overall length of the cavity to approximately f/2, simplifies the laser array system 100, and also increases the stability of the laser operation. In this example, the internal cavity 24 would be approximately 4.0 cm long, while a convention "4F" configuration the internal cavity 24 would be approximately 16.0 cm long.

Referring again to FIG. 1A, using the predetermined spacing D of the apertures 18 of the gain media 14 themselves to perform the role of the spatial filter, enables the Fourier Transform lens 26 to perform a mapping of the output from an array of gain media 14 back into to a very specific output pattern which can efficiently couple back into the gain media 14.

Since $D_2 = F \cdot \lambda / D_1 = f / 2 \cdot \lambda / D_1$ (as shown in FIG. 2) setting the aperture 18 spacing at the input to:

$$D_1 = \sqrt{\frac{f}{2} \cdot \lambda}$$

will result in $D_2 = D_1 = D$. If the reflector mirror is placed at the line of symmetry 42 (FIG. 2) the output image will map back onto, and couple into the input array of gain media with high efficiency. For example, a spacing between the apertures 18 of approximately 209.8 $\mu$m (distance D) would be appropriate for $\lambda$ approximately equal to 1.1 $\mu$m, a focal length f=8 cm, and thirteen gain media elements. It should be appreciated by one skilled in the art that there are many configurations where it would be advantageous to utilize a cavity where $D_1$ is not equal to $D_2$.

The assembly 10 is designed to operate without the need for collimating lenses to couple the input fibers or the output fibers to the assembly. This greatly simplifies the cavity design. If required, however, collimating lenses (not shown) can be incorporated into the design to match "f" numbers. This might be required in to increase the fraction of radiation that participates in the operation of the cavity.

Figure 3:
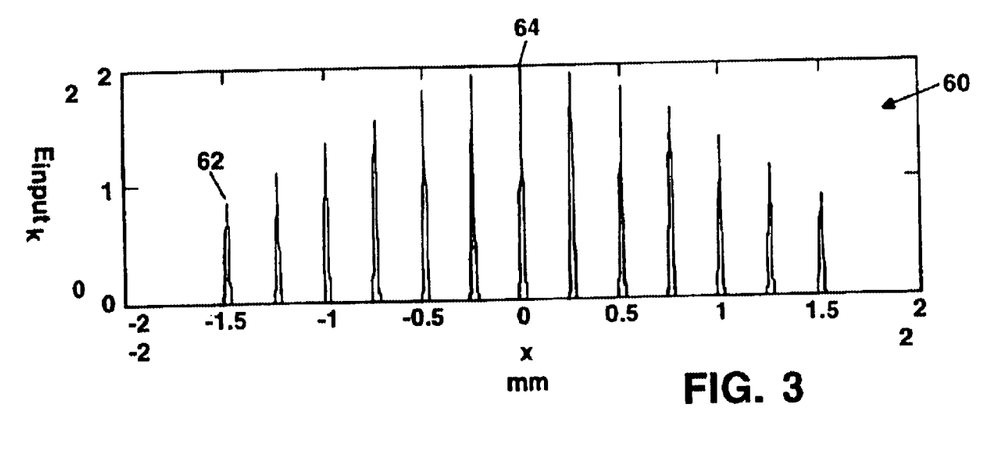
FIG. 3 is an exemplary radiation pattern showing the spatial distribution of input electric field of the system of FIG. 1A.
Figure 4:
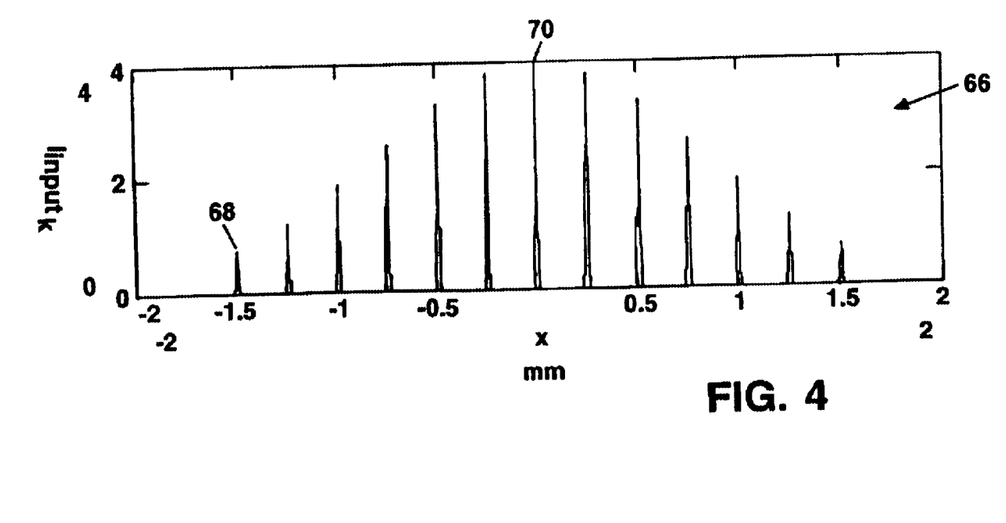
FIG. 4 is an exemplary radiation pattern showing the spatial distribution of input optical intensity of the system of FIG. 1A.

Now referring to FIGS. 3 and 4, a one dimensional input pattern includes an electric field input pattern ($E_{input}$) 60 and corresponding electric field input intensity pattern ($I_{input}$) 66.

Electric field input pattern ($E_{input}$) 60 is composed of three simple patterns:

1) C(x) Comb function, spaces the multiple fiber inputs (with spacing, in this case, approximately equal to 250 $\mu$m).
2) G(x) Gaussian radiation output function, describes the field pattern at the emitting surface of each gain media aperture. In this case, the width of the Gaussian functions entering the cavity is approximately equal to 11 $\mu$m.
3) E(x) Envelope function, describes the relative weightings of the fiber inputs (this includes the aperture function which limits the number of fiber inputs)

These functions are combined in the following manner to obtain the electric field input pattern I(x) 66;

$$I(x) = E(x) \cdot \{G(x) \otimes C(x)\} \quad (1)$$

where $\otimes$ represents a convolution operator.

The electric field input pattern ($E_{input}$) 60 of a fiber array is a function of x ($x_k$ measured in mm) evaluated at y=0 where k is a running index used in the software which generated this figure. The pattern 60 in the example of FIG. 3 corresponds to a 13 element array of single mode fiber lasers with core diameters of approximately 11 $\mu$m and a center-to-center spacing of $D_1$ approximately equal to 250 $\mu$m. In one embodiment $D_1$ is set to equal to $D_2$, although there is no requirement that $D_1 = D_2$.

As shown in FIG. 4, the input optical intensity pattern ($I_{input}$) 66 looks similar to the electric field input pattern 60

(FIG. 3) the same spacing in the comb function, but with narrower peaks and with a narrower envelope function. This input optical intensity pattern 66 is representative of the output intensity pattern of a linear array of optical fibers measured along the centerline of the fibers. The important point to be noted about the electric field input pattern 60 and the input optical intensity pattern 66 is that the Fourier transform of this function can be tailored to couple into an array of output gain media 14 with high efficiency.

Figure 5:
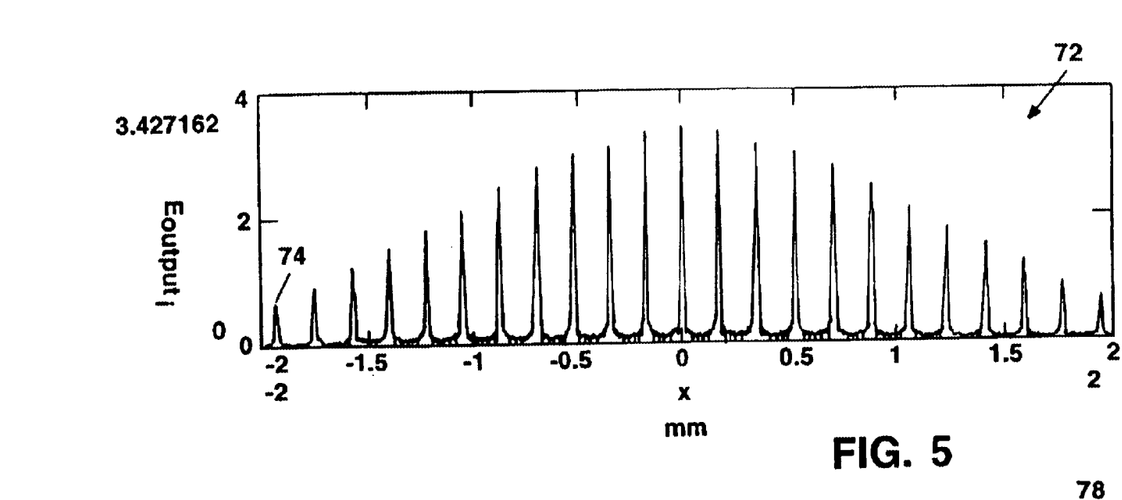
FIG. 5 is an exemplary radiation pattern showing the spatial distribution of output electric field of the system of FIG. 1A.
Figure 6:
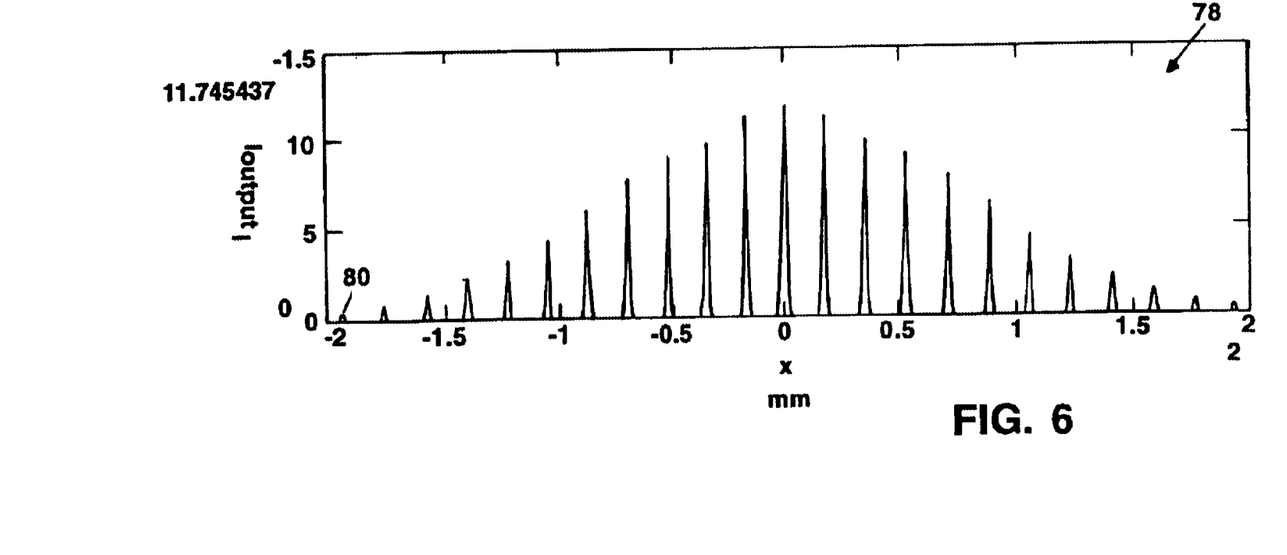
FIG. 6 is an exemplary radiation pattern showing the spatial distribution of output optical intensity of FIG. 1A.

Now referring to FIGS. 5 and 6, a calculated electric field output amplitude 72 ($E_{output}$) and a corresponding output optical intensity 78 ($I_{output}$) represent the Fourier transformed input function 64 (FIG. 3). The results of this transform with a laser wavelength of approximately 1.1 μm and a focal length (f) of 8.0 cm (F=4.0 cm) are shown in FIGS. 5 and 6. The output amplitude 72 waveform includes a series of spikes 74 (FIG. 5) with spacings of approximately 0.176 mm (176 μm). The output optical intensity 78 includes a series of spikes 80 (FIG. 6) with spacings of approximately 176 μm. The output optical intensity spikes 80 and output amplitude spikes 74 correspond to the regions of constructive interference 54 (FIG. 2). The apertures 18 are arranged so that the spikes 74 (or equivalently spikes 78) are aligned with the apertures 18.

An important aspect of the output optical intensity ($I_{output}$) 78 is that the input optical intensity 66 (FIG. 4) is efficiently coupled back into an array of fibers with individual core diameter of approximately 11 μm and with a center-to-center spacing of approximately 176 μm. The shape of both the input and output envelope functions is determined by the cavity modal properties of the laser during operation. During laser operation, the resulting envelope function adjusts itself to pass into the spatial filter provided by the apertures 18 with a predetermined spatial distribution and the corresponding spacings disposed therebetween (in this case, the predetermined spatial distribution is the separation of distance D), with maximum transmission.

In order to achieve coupling back into the same fibers from which the energy exited, $D_1$ is set equal to $D_2$ (in this example approximately 209.8 μm). This utilizes the same optical fibers in both the image and the Fourier plane. Thus, the compact cavity will be designed in the "folded" configuration in the half-f (f/2) design, as shown in FIG. 1A.

This architecture is designed to be directly scalable to higher numbers of fiber lasers to generate kW-level diffraction-limited output power. In fact, this design increases in power, efficiency, and stability as the number of laser elements in the system increases.

Figure 7:
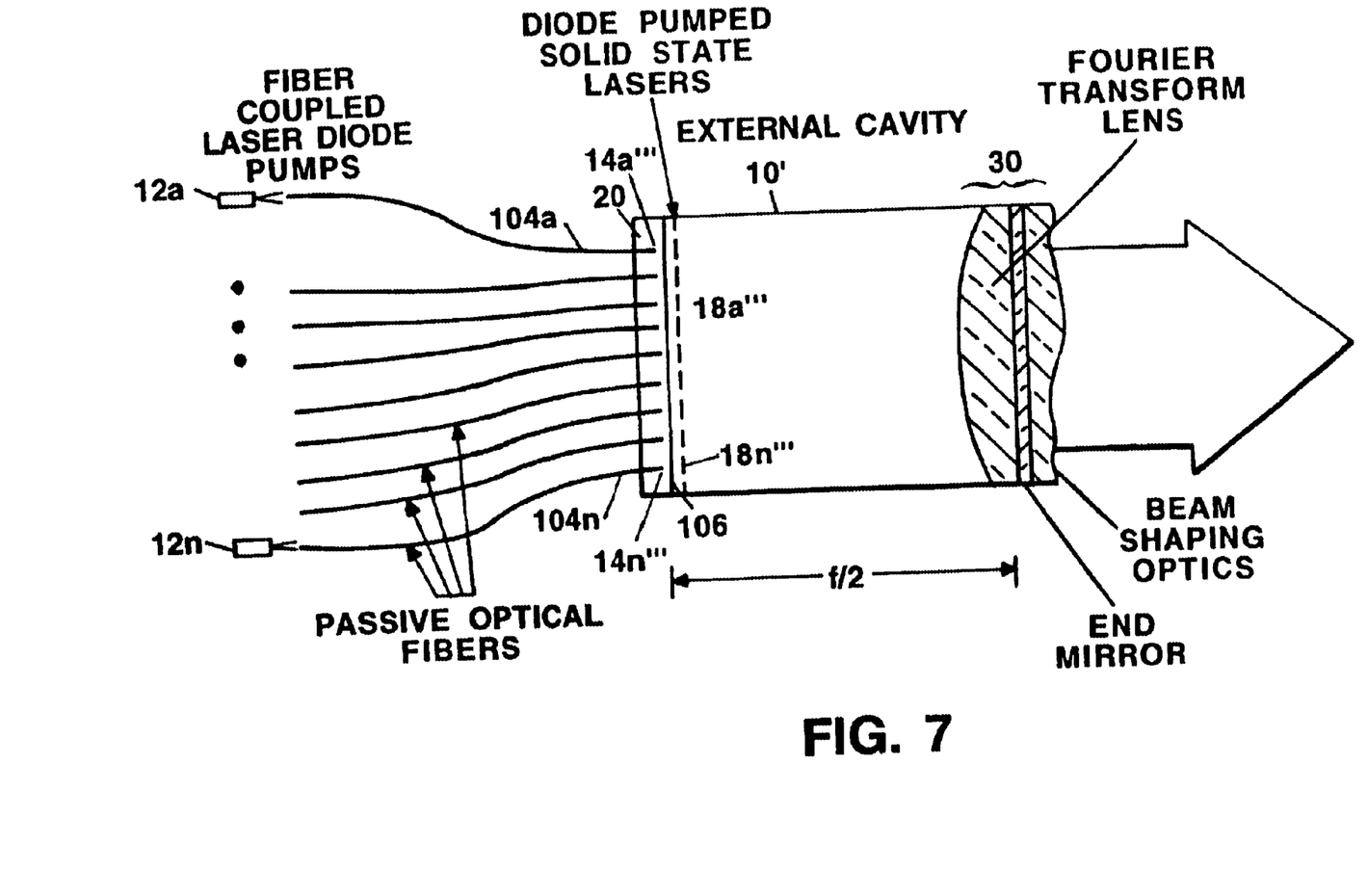
FIG. 7 is a schematic diagram of an of a compact phase locked laser array system including solid state lasers as the gain media according to another embodiment of the invention.

Now referring to FIG. 7, another embodiment of an assembly 10' includes a common element 30 and gain media 14a'''–14n''' (generally referred to as gain media 14'''), here for example, solid state lasers. The gain media are coupled to conduits 104a–104n, here passive optical fibers. The conduits 104a–104n (generally referred to as passive optical fibers 104) are coupled to a corresponding one of a plurality of electromagnetic gain media energy sources 12a–12n, here for example, pump diodes receive. Each one of the gain media 14a'''–14n''' includes a corresponding one of a plurality of apertures 18a'''–18n''' (generally referred to as apertures 18'''). The apertures 18''', here solid state lasers, are each spaced apart from a neighboring aperture 18''' in a predetermined spatial distribution having separation distances D to provide a spatial filter to establish a composite beam and radiation feedback to the gain media 14''' in order to provide phase coherency in the output beam. The assembly 10' further includes a single end mirror 106 disposed on the first end 20 of the assembly 10'. Optionally, polarization controllers (not shown) are incorporated into a coupling mechanism (not shown) at the apertures 18''' to ensure the appropriate interference among the radiation in the cavity. Optical path length controllers (not shown) are optionally incorporated into the coupling mechanism to ensure the appropriate boundary conditions for the radiation in the separate portions of the cavity.

In operation, the gain media 14''', solid state lasers in this embodiment of the laser array system 100 are pumped with fiber-coupled spatially removed laser diodes pump energy sources 12. The single end mirror 106 is used as a reflector. The single reflector 106 is high reflective (HR) coated at the appropriate lasing wavelength ($\lambda_{solid\ state}$) and anti-reflective (AR) coated at the pumping wavelength. The gain media 14''' are preferably solid state Nd:YAG lasers, Ruby lasers, Nd:YLF lasers, or Ho:YAG lasers. It will be appreciated by those of ordinary skill in the art that other solid state lasers can be used as the gain media 14'''.

Figure 8:
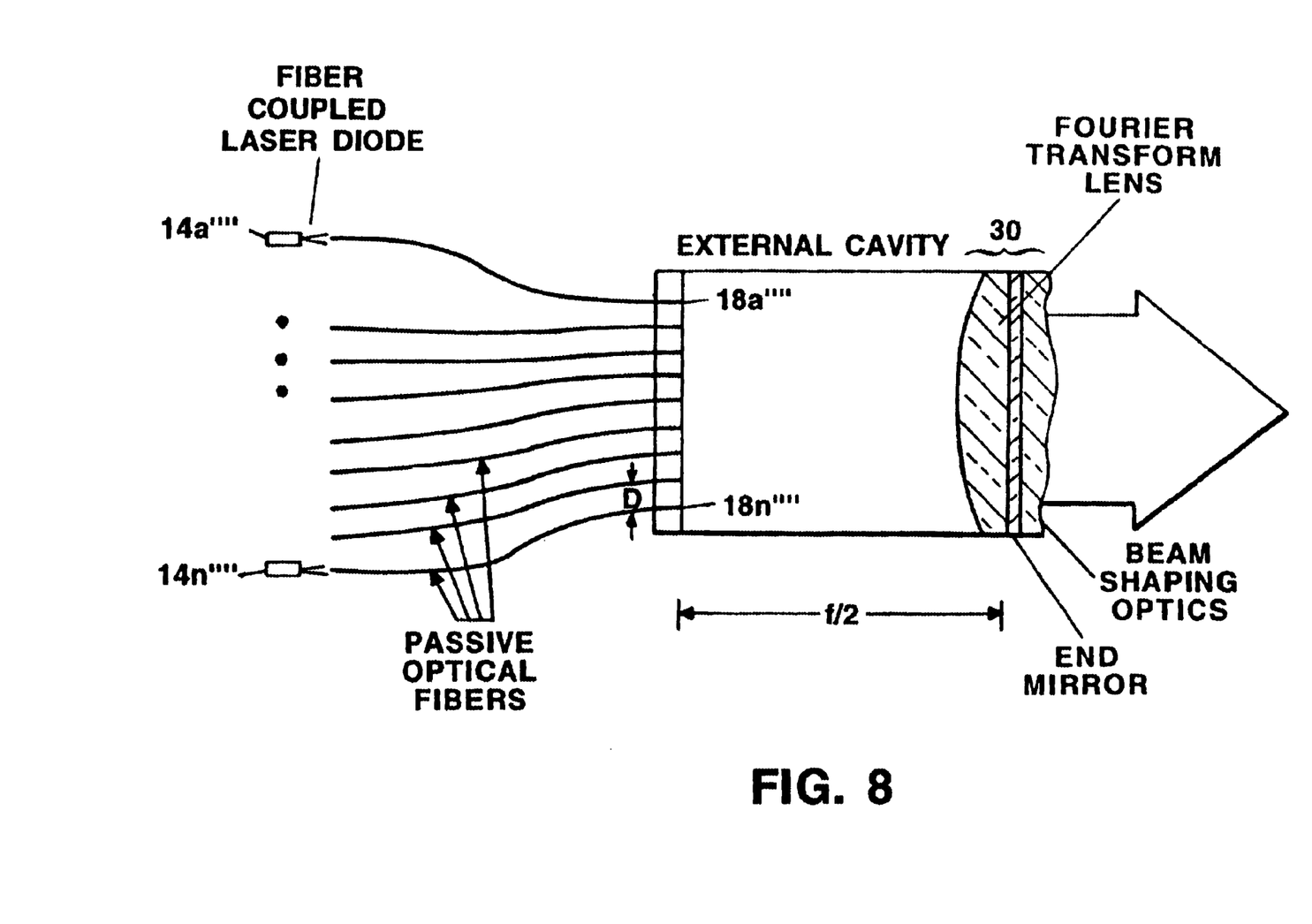
FIG. 8 is a schematic diagram of a compact phase locked laser array system including passive fiber coupled laser diodes as the gain media according to still another embodiment of the invention.

Now referring to FIG. 8, in a third embodiment of an assembly 10 includes a common element 30 and a plurality of gain media 14a''''–14n'''', here spatially removed laser diodes (generally referred to as gain media 14'''') coupled to conduits 104a–104n (generally referred to as conduits 104). It will be appreciated by those of ordinary skill in the art that the apertures 18'''' of the gain media 14'''' need not be physically at the gain media (as in FIG. 1A) but may be remote from the gain media 14''''41 and connected to the gain media through the conduits 104a–104n, here passive optical fibers. In operation, the gain media 14'''' are preferably antireflection coated on the facets adjacent to the conduits 104 and operate in conjunction with the conduits 104. In this embodiment of the laser array system 100, the conduits 104 provide a corresponding one of a plurality of apertures 18a''''–18n'''' (generally referred to as apertures 18'''') for the gain media 14''''. The apertures 18'''' are each spaced apart from a neighboring apertures 18'''' in a predetermined spatial distribution having a separation D. As described above, the predetermined spatial distribution of the apertures 18'''' and the corresponding spacings disposed therebetween provides the spatial filter to establish the composite beam and radiation feedback to the gain media 14'''' in order to provide phase coherency in the output.

A fourth embodiment (not shown) is a variation of the system shown in FIG. 8 and includes the use of monolithic laser arrays as the gain media. In this case, each laser stripe (not shown) within the monolithic device (or set of monolithic devices) is regarded as the independent gain element.

Figure 9:
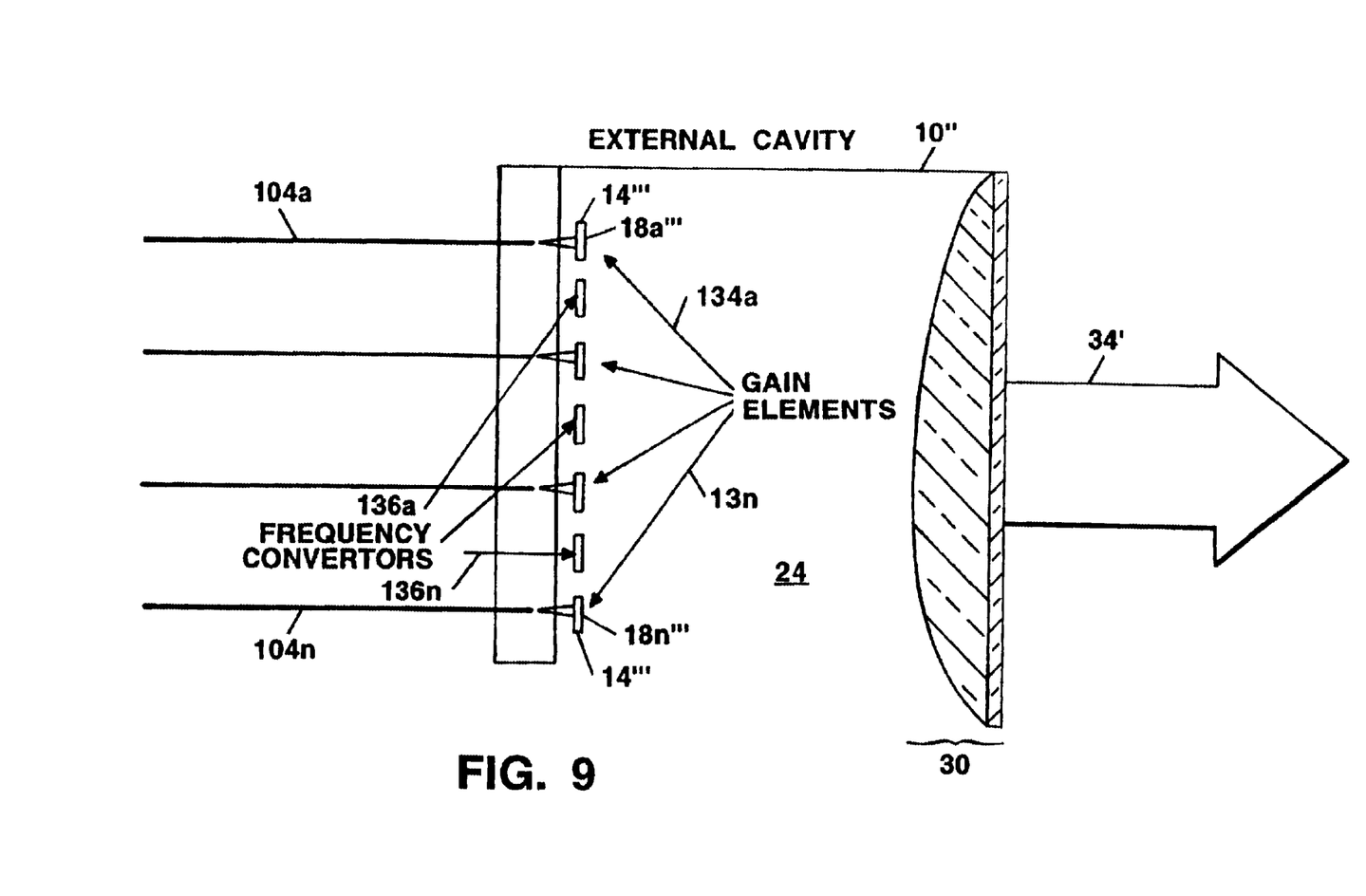
FIG. 9 is a schematic diagram of a compact phase locked laser array system including a plurality of frequency conversion devices offset from the plurality of gain media according to yet another embodiment of the invention.

Now referring to FIG. 9, a fifth embodiment of an assembly 10'' includes a common element 30, a plurality of gain media 14''', here solid state lasers, having apertures 18''' thereof. Although shown using the solid state laser configuration of FIG. 7, it will be appreciated by those of ordinary skill in the art that other devices can operate as the gain media either located within the internal cavity 24 or remote from the internal cavity 24 and coupled by a conduit 104 (FIG. 7). The assembly 10'' further includes a plurality of frequency conversion devices 136a–136n (generally referred to as frequency conversion devices 136) spatially offset from the gain media 14'''. The spatial distribution of the apertures 18''' and the frequency conversion devices 136 is predetermined such that the energy being distributed about the plurality of apertures 18''' of the gain media 14''' is initially directed to the frequency conversion devices 136.

In operation, the frequency conversion devices 136 are disposed to receive portions of the radiation from the gain media 14''' after it is directed back by the common element 30 in this embodiment of the laser array system 100. For example, this is accomplished by adjusting the spacing $D_1$ (FIG. 2) and $D_2$ (FIG. 2) so that every other peak in the returned radiation is incident upon the frequency conversion device and every other peak is incident upon the gain media 14. The output field is directed by the frequency conversion device 136 towards the common element 30 and back into the gain media in order to produce an output beam 34' with altered frequency characteristics but retaining phase coherency. The frequency conversion devices 136 can, for example, be frequency doubling crystals or other devices such as acoustic modulators, or polarization rotators. It will be appreciated by those of ordinary skill in the art, that the direction of the energy into the frequency conversion devices 136 can be accomplished by several different methods possibly using additional optical elements (not shown).

All publications and references cited herein are expressly incorporated herein by reference in their entirety.

Other embodiments are within the spirit and scope of the appended claims.

What is claimed is:

1. An electro-optical system, comprising:

a plurality of electromagnetic gain media, each of said plurality of gain media electromagnetic gain media having an aperture, wherein said plurality of electromagnetic gain media are disposed such that the apertures are arranged with a predetermined spatial distribution;

a refracting surface disposed to intercept energy emitted from the plurality of apertures of said plurality of electromagnetic gain media; and a partially reflecting surface disposed to direct portions of the energy intercepted by said refracting surface back toward the plurality of apertures through said refracting surface wherein said refracting surface is provided having a shape selected such that the directed energy is distributed about the plurality of apertures in a predetermined pattern.

2. The system of claim 1 wherein said refracting surface is a first surface of a lens and is spaced from the plurality of apertures by approximately one half a focal length of the refracting surface.

3. The system of claim 1 wherein the plurality of apertures have a corresponding Fourier plane and the apertures are disposed in said Fourier plane.

4. The system of claim 1 wherein the plurality of apertures have a corresponding Fourier plane and said Fourier plane is overlaid back onto the apertures by means of the refracting surface and the partially reflecting surface.

5. The system of claim 1 wherein the plurality of apertures have a corresponding spatial frequency plane and the plurality apertures are disposed in said spatial frequency plane.

6. The system of claim 1 wherein the electromagnetic gain media is at least one of:

a diode pumped fiber laser;

a fiber coupled diode laser, a gas laser;

a diode pumped solid state laser; and a monolithic laser diode array.

7. The system of claim 6 wherein the diode pumped solid state laser is at least one of:

a Nd:YAG laser;

a Ruby laser;

a Nd:YLF; and a Ho:YAG.

8. The system of claim 1 wherein the apertures of each of said plurality of electromagnetic gain media are disposed to maximize the amount of energy directed into each of the plurality of apertures.

9. The system of claim 8, wherein at least one spatial Fourier transform of a pattern of the intercepted energy is achieved upon a single round trip from an aperture to said partially reflecting surface and back from said partially reflecting surface to the aperture.

10. The system of claim 9 wherein the at least one Fourier transform of the pattern is overlaid on itself.

11. The system of claim 9 wherein the plurality of apertures is disposed in a predetermined spatial distribution such that a corresponding intercepted energy pattern has a plurality of intensity peaks at corresponding locations of the at least one Fourier transformed intensity pattern that is achieved through the action of the cavity.

12. The system of claim 1 wherein the spatial distribution is predetermined such that the energy being distributed about the plurality of apertures of the electromagnetic gain media is initially directed to a plurality of frequency conversion devices.

13. The system of claim 12 wherein the frequency conversion devices are frequency doubling crystals.

14. The system of claim 1 wherein the predetermined spatial distribution provides a spatial filter establishing a composite beam comprised of energy from the plurality of electromagnetic gain media with phase coherency.

15. The system of claim 14 wherein the refracting surface is closer to the partially reflecting surface than a Talbot distance $2D^2/\lambda$ where $\lambda$ is a nominal wavelength of the composite beam and D is a spacing between each of the plurality of apertures and a corresponding nearest neighboring aperture.

16. The system of claim 1 wherein said refracting surface is a first surface of a lens.

17. The system of claim 1 wherein the partially reflecting surface is a mirror.

18. The system of claim 1 wherein the refracting surface is adjacent to the partially reflecting surface.

19. The system of claim 1 wherein the regions of constructive interference are disposed on the apertures producing an output of the system a composite beam comprised of energy from the plurality of electromagnetic gain media with phase coherency.

20. The system of claim 1 wherein the predetermined spatial distribution of the apertures of each of said plurality of electromagnetic gain media provides a spatial filter which combines in parallel the energy from each of the plurality of electromagnetic gain media.

21. The system of claim 1 wherein the plurality of apertures includes N apertures where N is greater than two.

22. The system of claim 21 wherein said partially reflecting surface directs portions of the intercepted energy toward each of the N apertures.

23. The system of claim 1 wherein the plurality of apertures are located in corresponding Fourier planes.

24. The system of claim 1 wherein the refracting surface and the partially reflecting surface direct the energy emitted from each of the plurality of apertures, substantially back over the plurality of apertures.

25. The system of claim 1 wherein the plurality of apertures are disposed such that an interference pattern of energy emitted via said electromagnetic gain media has a plurality of spots at substantially the same position as the apertures of said electromagnetic gain media.

26. The system of claim 1 wherein the energy directed by said partially reflecting surface has, at a plane defined by the apertures of said electromagnetic gain media, a spatial pattern corresponding to a Fourier transform of an input energy spatial pattern of the energy emitted through the apertures of said electromagnetic gain media.

27. An electro-optical system, comprising:
a plurality of electromagnetic gain media having apertures thereof disposed in a predetermined spatial distribution;
a common optical element disposed to intercept energy from the plurality of electromagnetic gain media and partially direct the energy back toward the plurality of apertures of the plurality of electromagnetic gain media with the directed energy being distributed about the plurality of electromagnetic gain media; and
wherein the predetermined spatial distribution provides a spatial filter establishing a composite beam comprised of energy from the plurality of electromagnetic gain media with phase coherency.

28. The system of claim 27 wherein the composite beam is a laser beam.

29. An electro-optical system, comprising:
a plurality of electromagnetic gain media each of said plurality of electromagnetic gain media having an aperture, wherein said plurality of electromagnetic gain media are disposed such that the apertures are arranged with a predetermined spatial distribution;
a common optical element disposed to intercept energy emitted from the plurality of electromagnetic gain media for forming an interference pattern across the apertures, such interference pattern having regions of constructive interference and regions of destructive interference; and
wherein the regions of constructive interference are disposed on the apertures producing an output of the system a composite beam comprised of energy from the plurality of electromagnetic gain media with phase coherency.

30. An electro-optical system, comprising:
a plurality of electromagnetic gain media, each of said plurality of electromagnetic gain media having an aperture, wherein said plurality of electromagnetic gain media are disposed such that the apertures are arranged with a predetermined spatial distribution;
a common optical element disposed to intercept energy emitted from each of the plurality of electromagnetic gain media and to direct the energy from each of the plurality of electromagnetic gain media back toward the plurality of apertures of the plurality of electromagnetic gain media with the directed energy being distributed about the plurality of aperture; and
wherein the predetermined spatial distribution provides a spatial filter establishing a composite beam by combining in parallel the energy from each of the plurality of electromagnetic gain media.

31. The system of claim 30 wherein the composite beam is a composite phase coherent laser beam.

32. An electro-optical system, comprising:
a plurality of electromagnetic gain media each of said plurality of electromagnetic gain media having an aperture, wherein said plurality of electromagnetic gain media are disposed such that the apertures are arranged to emit electromagnetic energy in a predetermined spatial distribution;
a common optical element disposed to intercept electromagnetic energy emitted from the plurality of electromagnetic gain media and to direct the electromagnetic energy back toward the plurality of apertures of the plurality of electromagnetic gain media with the directed electromagnetic energy being distributed about the apertures, such common optical element comprises a lens adjacent to a partially reflecting surface.

33. An electro-optical system, comprising:
a plurality of electromagnetic gain media each of said plurality of electromagnetic gain media having an aperture, wherein said plurality of electromagnetic gain media are disposed such that the apertures are arranged with a predetermined spatial distribution;
a common optical element disposed approximately to intercept energy emitted from the plurality of electromagnetic gain media and partially direct the energy back toward the plurality of apertures of the plurality of electromagnetic gain media with the directed energy being distributed about the apertures, wherein said common optical element comprises a Fourier transform lens adjacent to a partially reflecting surface.

34. An electro-optical system, comprising:
a plurality of electromagnetic gain media each of said plurality of electromagnetic gain media having an aperture, wherein said plurality of electromagnetic gain media are disposed such that the apertures are arranged with a predetermined spatial distribution having a spacing D;
a common optical element having a refracting surface and a partially reflecting surface, and disposed to direct the energy back toward the plurality of apertures of the plurality of electromagnetic gain media with the directed energy being distributed about the apertures, such common optical element being spaced apart from the apertures to intercept energy from the plurality of electromagnetic gain media by approximately a distance $D^2/\lambda$ where $\lambda$ is a nominal wavelength of an output beam.

35. An electro-optical system, comprising:
a plurality of electromagnetic gain media each of said plurality of electromagnetic gain media having an aperture, wherein said plurality of electromagnetic gain media are disposed such that the apertures are arranged with a predetermined spatial distribution;
a common optical element comprising:
a refracting surface disposed to intercept energy emitted from the plurality of apertures;
a partially reflecting surface disposed to direct a portion of the intercepted energy back toward the plurality of apertures with the directed energy being distributed among the plurality of apertures; and
such common optical element being spaced apart from the plurality of apertures by approximately one half a focal length of the common optical element.

36. The system of claim 35 wherein the common optical element comprises a lens having a first surface corresponding to said refracting surface and a second surface corresponding to said partially reflecting surface.

37. The system of claim 35 wherein the changes partially reflecting surface reflects the directed energy and partially transmits the directed energy to form an output beam.

38. A cavity for combining electromagnetic energy from a plurality of electromagnetic gain media having a corresponding plurality of apertures, comprising:

a housing having a first surface;

a plurality of slots disposed on said first surface in a predetermined spatial distribution to receive the plurality of electromagnetic gain media;

a common optical element disposed to intercept energy passed through the plurality of apertures, wherein the common optical element is disposed to direct the intercepted energy back toward and distributed upon the plurality of apertures; and wherein the predetermined spatial distribution provides a spatial filter establishing a composite beam comprised of energy from the plurality of electromagnetic gain media with phase coherency.

39. A method of producing a phase coherent beam comprising:

providing a plurality of apertures for a plurality of electromagnetic gain media, for producing a plurality of radiation beams;

providing a refracting surface and a partially reflecting surface disposed to reflect portions of the radiation beams; and spacing each of the plurality of apertures apart in a predetermined spatial distribution to provide a spatial filter, wherein each of the plurality of apertures receives a portion of the reflected portions of the radiation beams, for establishing a composite beam comprised of energy from the plurality of electromagnetic gain media having phase coherency.

* * * * *